(12) United States Patent
Hannebauer

(10) Patent No.: US 7,723,686 B2
(45) Date of Patent: May 25, 2010

(54) IMAGE SENSOR FOR DETECTING WIDE SPECTRUM AND METHOD OF MANUFACTURING THE SAME

(75) Inventor: Robert Hannebauer, Vancouver (CA)

(73) Assignees: Hanvision Co., Ltd. (KR); Lumiense Photonics Inc., Vancouver (CA)

( * ) Notice: Subject to any disclaimer, the term of this patent is extended or adjusted under 35 U.S.C. 154(b) by 0 days.

(21) Appl. No.: 12/191,447

(22) Filed: Aug. 14, 2008

(65) Prior Publication Data

US 2010/0038540 A1 Feb. 18, 2010

(51) Int. Cl.
*G01J 5/00* (2006.01)
(52) U.S. Cl. .......................................... 250/349
(58) Field of Classification Search ................. 250/349, 250/339.01
See application file for complete search history.

(56) References Cited

U.S. PATENT DOCUMENTS 5,404,125 A * 4/1995 Mori et al. .................. 338/18
5,656,816 A * 8/1997 Tanaka ................... 250/339.01

FOREIGN PATENT DOCUMENTS

WO WO 2007032632 A1 * 3/2007

OTHER PUBLICATIONS

M. S. Kowitt, D. J. Fixsen, A. Goldin, and S. S. Meyer, "Frequency selective bolometers." Applied Optics, Optical Society of America, vol. 35, No. 28, Oct. 1, 1996, pp. 5630-5365. [DOI: 10.1364/AO.35.005630].*

* cited by examiner

*Primary Examiner*—Constantine Hannaher
(74) *Attorney, Agent, or Firm*—Cantor Colburn LLP

(57) ABSTRACT

An image sensor for detecting a wide spectrum includes a plurality of infrared ray receiving layers which individually receive infrared rays having different wavelengths for each pixel, the plurality of infrared ray receiving layers stacked to each other. The image sensor, which is an integrated image sensor where at least two micro bolometers are stacked, acquires spectrum information about visible rays and near-infrared rays as well as two or more infrared rays applied on an object, without mechanical/thermal/optical distortion, and provides the spectrum information to a silicon-based semiconductor such as a photodiode, thereby improving photoelectric conversion efficiency.

16 Claims, 14 Drawing Sheets

IMAGE SENSOR FOR DETECTING WIDE SPECTRUM AND METHOD OF MANUFACTURING THE SAME

BACKGROUND OF THE INVENTION

1. Field of the Invention

The present invention relates to an image sensor, and more particularly, to an image sensor for detecting a wide spectrum, in order to effectively detect various visible and infrared spectrum and accordingly enhance photoelectric conversion efficiency.

2. Description of the Related Art

In general, an image sensor is an electrical device for converting an optical image, that is, changes in light, into an electrical signal, and is used widely in mobile phones, digital still cameras, personal digital assistants (PDAs), toys, electronic games, robots, personal computer cameras, optical computer mice, office scanners, security surveillance cameras, night infrared cameras, recognition systems, biometric systems, wireless endoscopes, etc.

Meanwhile, one of various methods for obtaining visible images is to obtain visible color images in a visible region having wavelengths of 400 through 700 nm using a TV camera, etc.

For example, there has been developed a method of capturing red/green/blue (RGB) images at different times by rotating a color filter wheel and then combining the RGB images, a method of separating light into its spectral components using an optical spectroscope and a plurality of image sensors (generally, three RGB image sensors) to distinguish colors apart, and a method of representing colors through a single image sensor using a Bayer pattern invented by Dr. Bayer. The method using the Bayer pattern, among the methods, has low color reproducibility compared to the other two methods. Recently, a method of representing colors using the fact that the depth of silicon in which light is permeated depends on the wavelength of the light has been proposed.

In the above-described methods, the reason of creating a color image by separating RGB colors from each other, detecting and then combining the RGB colors upon viewing is because the shape and color of an object depend on the wavelengths of RGB colors. That is, an object has its intrinsic apparent characteristics in various wavelengths regions which also extend beyond the visible light region.

Accordingly, when a target object is measured in various optical regions having different spectrums, such as ultraviolet rays, near-infrared rays and infrared rays, as well as visible rays, more information about the target object can be obtained. That is, a color can be defined as a combination of two or more pieces of wavelength spectrum information, instead of as a simple RGB combination. In this case, images which are different from those which human eyes sense may appear, but such images will contain useful information when they are applied to an automated imaging system such as a machine vision system.

In general, a part of ultraviolet rays, visible rays, and near-infrared rays having wavelengths shorter than 1 µm, are sensed by a silicon-based image sensor, and infrared rays having wavelengths longer than 1 µm are sensed by an image sensor made of InSb, MCT, etc.

In order to create multichannel images using the above-described methods, different cameras including different image sensors and different technologies are needed.

However, in the case where two or more image sensors or cameras are used, a serious problem occurs in an optical arrangement upon manufacturing the image sensors or cameras, and mechanical/thermal/optical distortion is generated due to environmental factors. Accordingly, an electrical/mechanical/optical system for compensating for such mechanical/thermal/optical distortion is needed, which results in an increase of cost.

SUMMARY OF THE INVENTION

The present invention provides an image sensor for detecting a wide spectrum, in which a plurality of light receiving layers, each light receiving layer absorbing light with an individual wavelength range, are stacked on a semiconductor device. Also, the present invention provides a semiconductor device to detect spectrums of various rays, such as ultraviolet rays, visible rays, near-infrared rays, far-infrared rays, and middle infrared rays, individually, according to their wavelengths, in a single pixel, thereby reducing light losses and enhancing photoelectric conversion efficiency.

Also, the present invention provides a method of manufacturing an image sensor for detecting a wide spectrum, in which a multi-layer light receiving structure (of semiconductor layers) for receiving light having various spectrums is formed on a single substrate, each light receiving layer of the multi-layer light receiving structure sensing light having an individual wavelength range, to individually detect infrared rays, ultraviolet rays, visible rays, and near-infrared rays.

According to an aspect, there is provided an image sensor for detecting a wide spectrum including: a multi-layer micro bolometer structure including a multi-layer micro bolometer and two shield layers, wherein the multi-layer micro bolometer include a first detector including an absorber for absorbing light and converting the light into heat and a resistor whose resistance varies according to a change in temperature of the absorber, a first thermal sink separated by an empty space from the lower surface of the first detector, and a second detector having the same structure as a structure of the first detector and separated by an empty space from the lower surface of the first thermal sink, the two shield layers respectively positioned over and below the multi-layer micro bolometer and made of a silicon layer and an oxide layer, and the multi-layer micro bolometer is repeatedly formed one or more times in such a manner that each multi-layer micro bolometer is divided by a shield layer, thereby forming a multi-layer structure; and a transistor layer applied on the multi-layer micro bolometer structure, electrically connected to the first detector and the second detector, and processing signals detected by the first detector and the second detector.

The first detector and the second detector contact the lower and upper surfaces of the first thermal sink, respectively, by electrostatic attraction force generated by applying a potential difference at regular time intervals to the first thermal sink, the first detector, and the second detector.

A first oxide layer is formed on one of the shield layer, a second oxide layer is formed on the first detector, a third oxide layer is formed on the first thermal sink, and a fourth oxide layer is formed on the second detector, and the empty spaces are formed by partially removing the first through fourth oxide layers.

The image sensor further includes: a single-layer micro bolometer including a third detector separated by an empty space from the multi-layer micro bolometer and having the same structure as the structure of the first detector, and a second thermal sink separated by an empty space from the third detector, wherein the transistor layer is electrically connected to the third detector and processes signals detected by the third detector.

The first detector and the second detector contact the lower and upper surfaces of the first thermal sink, respectively, by electrostatic attraction force generated by applying a potential difference at regular time intervals to the first thermal sink, the first detector and the second detector, and the third detector contacts the second thermal sink by electrostatic attraction force generated by applying a potential difference at regular time intervals to the second thermal sink and the third detector.

A first oxide layer is formed on one of the shield layer, a second oxide layer is formed on the first detector, a third oxide layer is formed on the first thermal sink, a fourth oxide layer is formed on the second detector, a fifth oxide layer is formed on the second thermal sink, and a sixth oxide layer is formed on the third detector, and the empty spaces are formed by partially removing the first through sixth oxide layers.

The absorber has a multi-layer structure including at least one of a nitride ($Si_3N_4$) layer, an oxide layer, or a dielectric layer, and has wavelength selectivity.

The resistor is a thin single-crystalline silicon layer with a serpentine structure having a narrow, curved shape.

The two shield layers each includes a silicon layer and an oxide layer and is grounded.

The transistor layer has MOS semiconductor structures.

The MOS semiconductor structure is transistors manufactured using a bulk semiconductor process.

The MOS semiconductor is a bipolar junction transistor (BJT) insolated by dielectric or a flip-fet transistor isolated by dielectric.

The MOS semiconductor structure is a transistor having four terminals of a source, a drain, a top-side gate, and a back-side gate.

By forming a photo diode layer on the multi-layer micro bolometer structure, a ultraviolet ray, a visible ray, a near-infrared ray, or a combination of spectrums of the ultraviolet ray, the visible ray, and the near-infrared ray are detected.

According to another aspect, there is provided a method of manufacturing an image sensor, including: forming a buffer oxide layer and a dielectric layer sequentially on an upper surface of a handle wafer, thus preparing a working substrate; forming a first oxide layer, an absorber, a resistor, a second oxide layer, a first thermal sink, a third oxide layer, an absorber, a resistor, and a fourth oxide layer, sequentially, on the dielectric layer which is a top layer of the working substrate, thus forming a multi-layer micro bolometer, wherein the multi-layer micro bolometer is repeatedly formed one or more times to form a multi-layer bolometer structure; forming a silicon-on-insulator (SOI) thin layer on the multi-layer micro bolometer structure; forming a transistor circuit on the SOI thin layer; electrically connecting the transistor circuit to the resistor; and forming a metal layer including a bump on the transistor circuit.

The method further includes forming a second thermal sink, a fifth oxide layer, an absorber, a resistor, and a sixth oxide layer on the dielectric layer which is the top layer of the working substrate, between the preparing of the working substrate and the forming of the multi-layer micro bolometer structure, thus forming a single-layer micro bolometer on the multi-layer bolometer structure.

Additional aspects of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

DETAILED DESCRIPTION OF EXEMPLARY EMBODIMENTS

Figure 1:
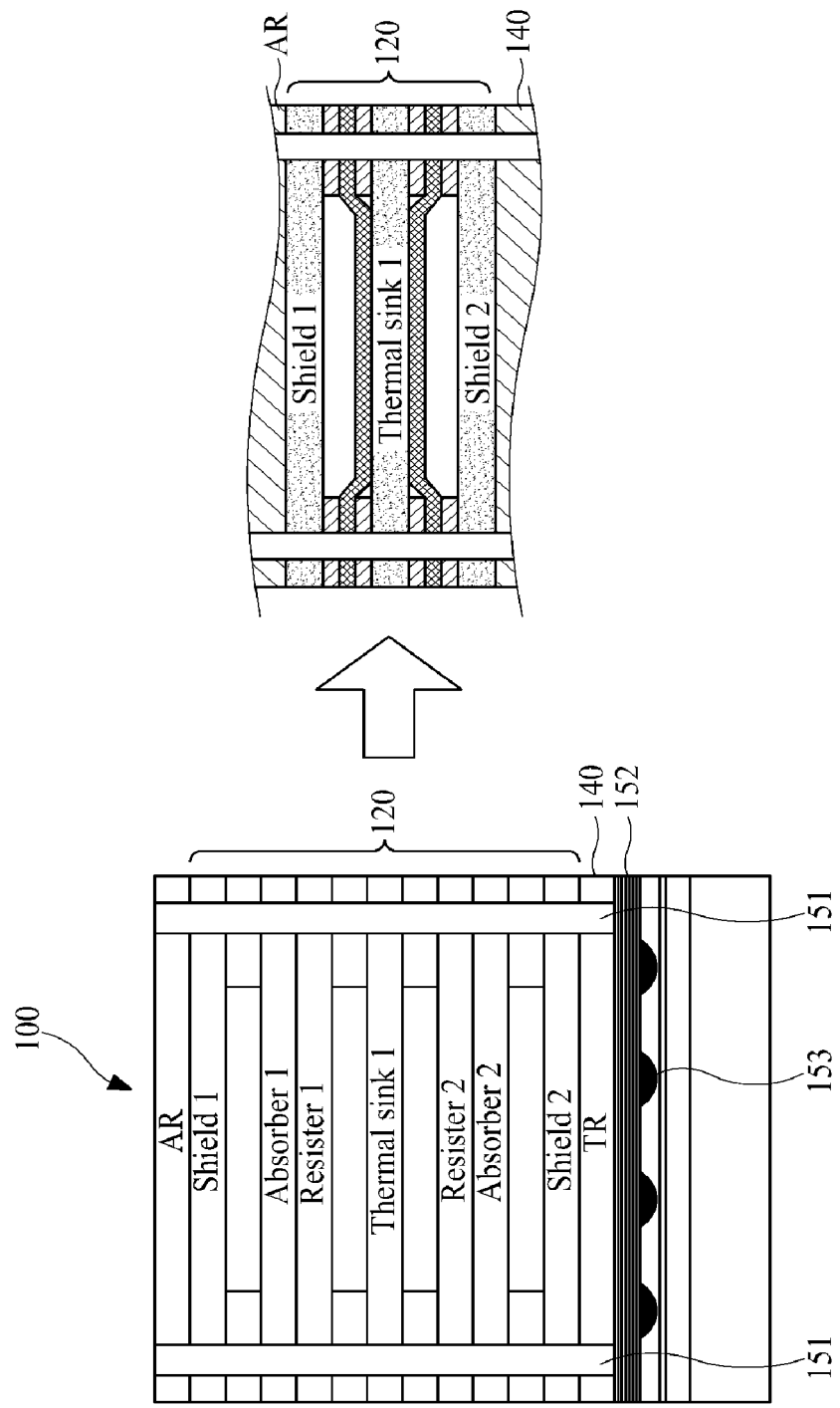
FIG. 1 is a sectional view of an image sensor for detecting a wide spectrum, according to an exemplary embodiment.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 2:
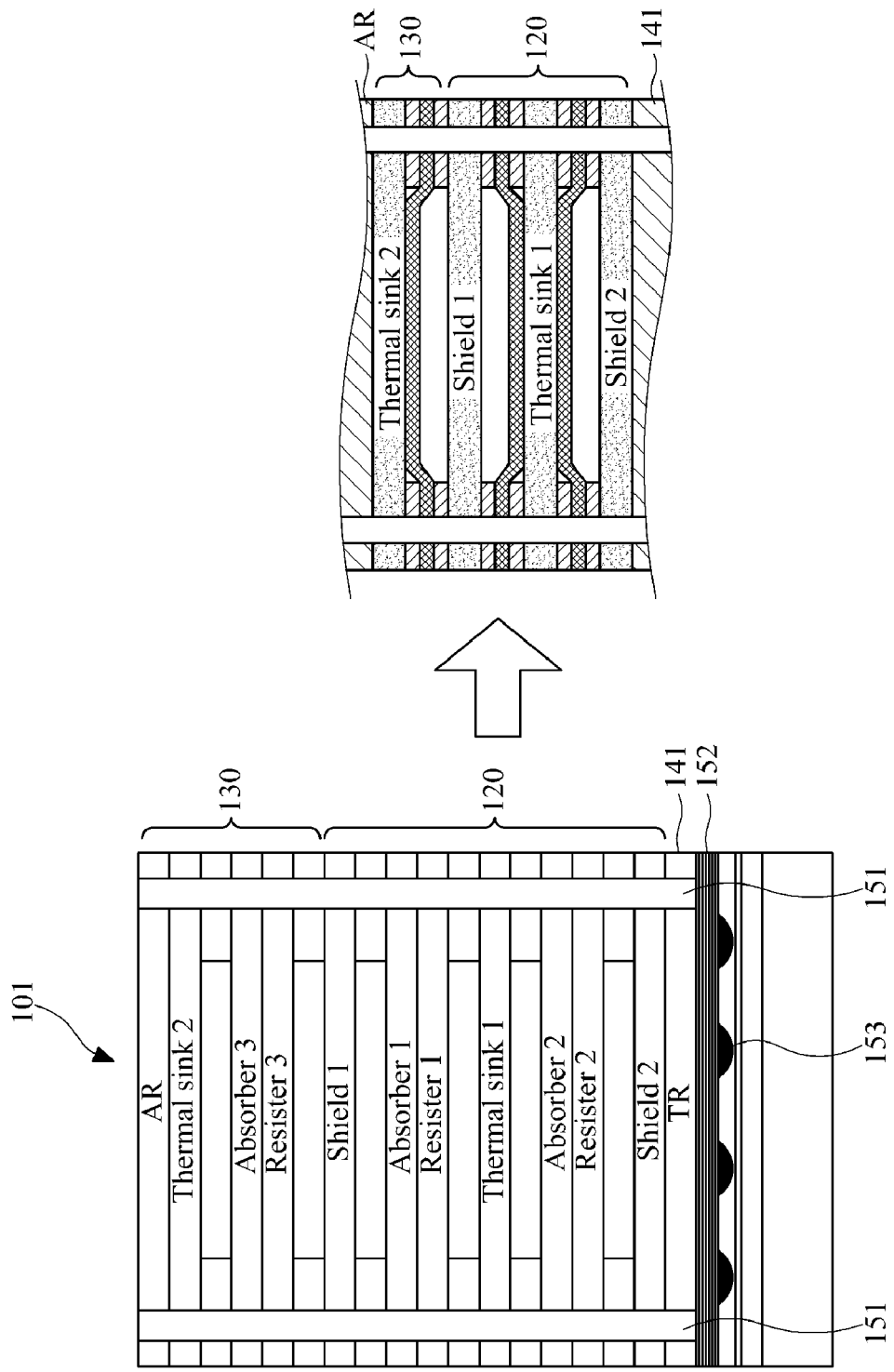
FIG. 2 is a sectional view of an image sensor for detecting a wide spectrum, according to another exemplary embodiment.

FIG. 1 is a sectional view of an image sensor 100 for detecting a wide spectrum, according to an exemplary embodiment, and FIG. 2 is a sectional view of an image sensor 101 for detecting a wide spectrum, according to another exemplary embodiment. The right sides of FIGS. 1 and 2 show the sectional views of portions of the image sensors 100 and 101 when the temperature is being reset using electrostatic attraction force to eliminate accumulated heat from the image. Here, the left and right parts of FIGS. 1 and 2 are shown in different scales, and the boundaries of some layers are omitted.

Referring to FIG. 1, the image sensor 100 includes a multi-layer micro bolometer structure 120, and a transistor layer 140 which is located below the multi-layer micro bolometer structure 120.

The multi-layer micro bolometer structure 120 includes a multi-layer micro bolometer layer comprising a first detector which detects an infrared ray having a predetermined wavelength, a first thermal sink Thermal sink 1 which is separated by an empty space from the lower surface of the first detector, and a second detector which is separated by an empty space from the lower surface of the first thermal sink Thermal sink 1 and detects an infrared ray having a wavelength different from the wavelength detected by the first detector; and two shield layers Shield 1 and Shield 2 which are located respectively over and below the multi-layer micro bolometer layer. The multi-layer micro bolometer structure can be repeatedly formed one or more times in such a manner that each multi-layer micro bolometer layer is divided by a shield layer.

The first and second detectors respectively include first and second absorbers Absorber 1 and Absorber 2 for absorbing light and converting it into heat, and first and second resistors Resistor 1 and Resistor 2 whose one surfaces contact the first and second absorbers Absorber 1 and Absorber 2 and whose resistances vary according to changes in temperature of the first and second absorbers Absorber 1 and Absorber 2.

The first and second absorbers Absorber 1 and Absorber 2, each of which is a multi-layer structure made of at least one of nitride (for example, $Si_3N_4$), oxide or dielectric material, have wavelength selectivity, and improve light receiving efficiency because they are positioned near the optical incident surface of the multi-layer micro bolometer layer 120.

Also, the first and second resistors Resistor 1 and Resistor 2, each of which is a single-crystalline silicon thin film with a serpentine structure having a narrow, curved shape, improve a rate of change in electrical characteristics (in this case, resistance) caused by heat transmitted from the absorbers Absorber 1 and Absorber 2.

Also, a first oxide layer is formed on the second shield layer Shield 2, a second oxide layer is formed on the second detector, a third oxide layer is formed on the first thermal sink Thermal sink 1, and a fourth oxide layer is formed on the first detector.

The empty spaces are formed by partially removing the first through fourth oxide layers.

The first thermal sink Thermal sink 1 includes a silicon layer and an oxide layer. The first detector contacts the upper surface of the first thermal sink Thermal sink 1 and the second detector contacts the lower surface of the first thermal sink Thermal sink 1, by electrostatic attraction force generated by applying a potential difference to the first thermal sink Thermal sink 1 and the first and second detectors at regular intervals, so that heat of the first and second detectors is transmitted to the first thermal sink Thermal sink 1.

A period in which the first and second detectors respectively contact the upper and lower surfaces of the first thermal sink Thermal sink 1, as described above, is referred to as a temperature reset period, and the state of the image sensor in the temperature reset period is shown in the right part of FIG. 1.

The shield layers Shield 1 and Shield 2 each includes a silicon layer and an oxide layer, like the first thermal sink Thermal sink 1.

In the image sensor 100 according to the exemplary embodiment, the transistor layer 140 is electrically connected to the first and second detectors of the multi-layer micro bolometer structure 120 and processes signals detected by the first and second detectors. The transistor layer 140 may have a MOS semiconductor structure.

Here, the transistor layer 140 includes pixel unit circuits corresponding to the first and second detectors, respectively. The structure of the transistor layer 140 is well known to those skilled in the art, and accordingly a detailed description thereof is omitted.

Now, referring to FIG. 2, the image sensor 101 according to another exemplary embodiment includes a multi-layer micro bolometer structure 120, a single-layer micro bolometer structure 130 stacked on the multi-layer micro bolometer structure 120, and a transistor layer 141 which is located below the multi-layer micro bolometer structure 120.

In the image sensor 101, the multi-layer micro bolometer structure 120 includes a multi-layer micro bolometer layer comprising a first detector which detects light having a predetermined wavelength of an infrared ray, a first thermal sink Thermal sink 1 which is separated by an empty space from the lower surface of the first detector, a second detector which is separated by an empty space from the lower surface of the first thermal sink Thermal sink 1 and detects an infrared ray having a wavelength different from that detected by the first detector; and two shield layers Shield 1 and Shield 2 which are located respectively over and below the multi-layer micro bolometer layer. The multi-layer micro bolometer structure 120 can have a plurality of micro bolometers. In this specification, for convenience of description, the multi-layer micro bolometer structure 120 having a pair of micro bolometers is shown.

The first and second detectors have the same structures as those of the first and second detectors of the image sensor illustrated in FIG. 1, and accordingly a detailed description thereof is omitted.

Also, detailed descriptions for the empty spaces of the multi-layer micro bolometer structure 120, the first thermal sink Thermal sink 1, and the shield layers Shield 1 and Shield 2 will be omitted because they are the same structures as the corresponding components described above with reference to FIG. 1.

In the image sensor 101 according to another exemplary embodiment, the single-layer micro bolometer layer 130 includes a third detector, and a second thermal sink Thermal sink 2 which is separated by an empty space from the third detector.

The third detector has the same structure as that of the first and second detectors.

The second thermal sink Thermal sink 2 includes a silicon layer and an oxide layer. The third detector contacts the second thermal sink Thermal sink 2, by electrostatic attraction force generated by applying a potential difference to the second thermal sink Thermal sink 2 and the third detector at regular intervals, so that heat of the third detector is transmitted to the second thermal sink Thermal sink 2.

A period in which the third detector contacts the second thermal sink Thermal sink 2 is referred to as a temperature reset period. The temperature reset period is synchronized to the temperature reset period in which the first and second detectors contact the first thermal sink Thermal sink 1, and the state of the image sensor in the temperature reset period is shown in the right side of FIG. 2.

In the image sensor 101 according to another exemplary embodiment, the transistor layer 141 is electrically connected to the first and second detectors of the multi-layer micro bolometer structure 120, and the third detector of the single-layer micro bolometer layer 130, and processes signals detected by the first, second and third detectors.

Here, the transistor layer 141 includes pixel unit circuits corresponding respectively to the first, second and third detectors, and the structure of each pixel unit circuit is well known to those skilled in the art and accordingly a detailed description thereof will be omitted.

According to the image sensors 100 and 101 as described above, it is possible to individually detect infrared rays having different wavelengths through the first, second and third detectors, using the fact that a depth to which an infrared ray is permeated depends on the wavelength of the infrared ray, and to effectively reset a temperature without an external mechanical chopper, thus reducing wrong operations of the first, second and third detectors and accordingly enhancing sensitivity and response characteristics.

Before explaining a method of manufacturing the image sensor 100 or 101, a ultrathin-film transfer process used in the image sensor manufacturing method will be described briefly with reference to FIGS. 3 through 7.

Figure 3:
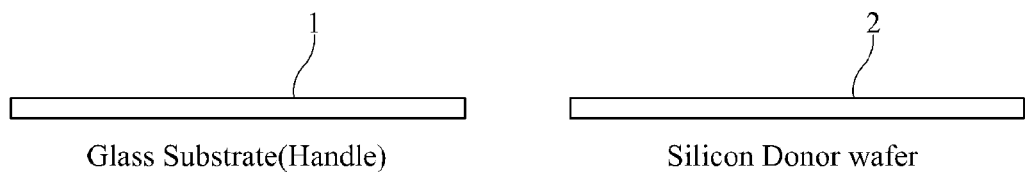
FIGS. 3 through 7 are views for explaining a ultrathin-film transfer process.
Figure 4:
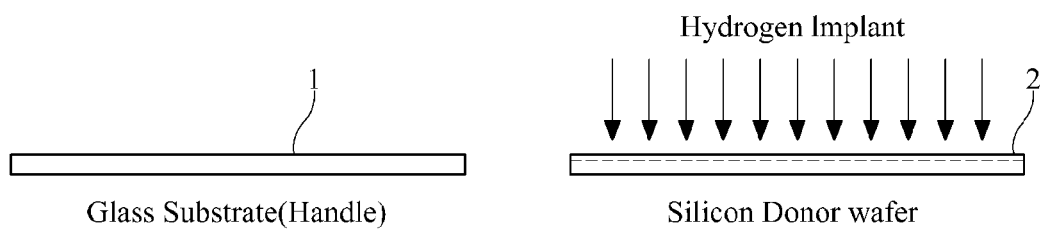
Figure 5:
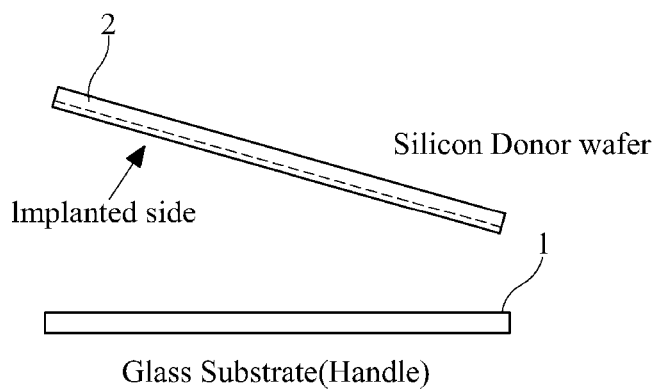
Figure 6:
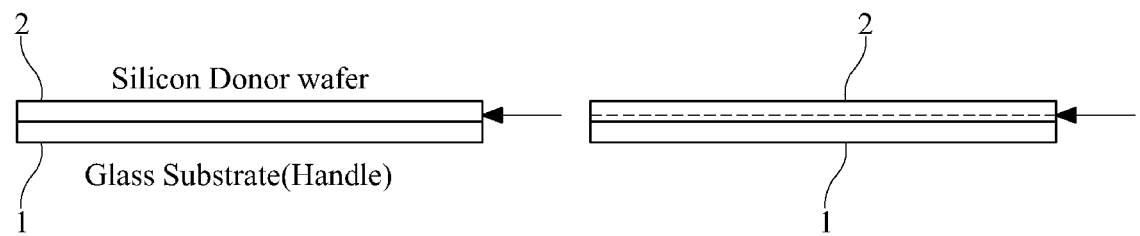

As illustrated in FIG. 3, first, a handle wafer 1 and a donor wafer 2 are prepared respectively. As illustrated in FIG. 4, a hydrogen ion implanting process is performed on the donor wafer 2, so that hydrogen ions are implanted to a specific depth. Due to the hydrogen ion implanting process, Si atom cohesion at the specific depth of the donor wafer 2 is weakened. Particularly, if the concentration of hydrogen in silicon exceeds the solid solubility, a large amount of hydrogen ion acts as a cleaving center upon the wafer being heated. Then, as illustrated in FIG. 5, the donor wafer 2 is placed on the handle wafer 1. At this time, the ion-implanted surface of the donor wafer 2 contacts the handle wafer 1. Then, as illustrated in FIG. 6, the two wafers 1 and 2 are bonded to each other. The bonding process is accelerated by plasma, which is not illustrated in the drawings. Then, predetermined pressure is applied to the bonded wafers 1 and 2. When the wafers 1 and 2 are completely bonded, strong coupling force corresponding to about 80% of covalent bonding force is formed between the wafers 1 and 2.

Figure 7:
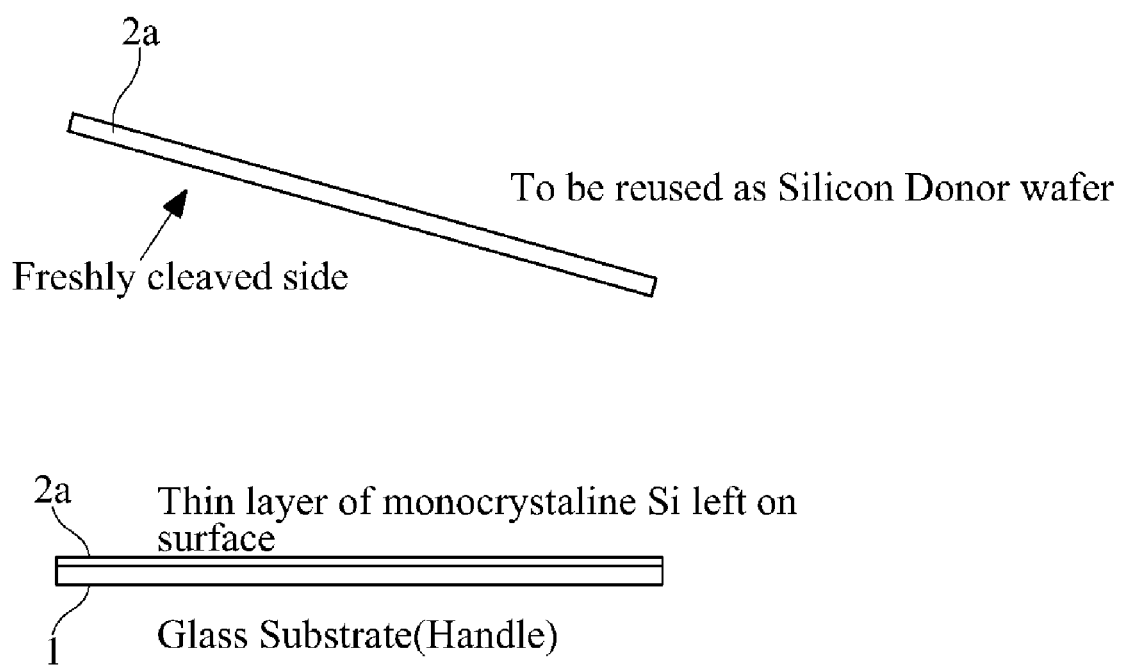

If the bonding process of the wafers 1 and 2 is complete, the bonded wafers 1 and 2 are subjected to heat treatment. Thus, the hydrogen in the silicon aggregate, and the donor wafer 2 is split along a crystal plane and is divided into two parts 2a and 2b as illustrated in FIG. 7. The divided donor wafer 2b can be recycled after polishing, forming a silicon oxide layer thereon and cleaning.

In the current embodiment, a Smartcut process of performing thin layer transfer by implanting hydrogen ions is explained, but, a nano-cleave technique developed by SiGen, in which a Si layer and a SiGe layer are formed on a donor wafer and then thin layer transfer is performed, can be used. In this case, instead of forming an oxide layer and implanting hydrogen ions, a thin layer is formed using a Si-EPI deposition process and only a Si layer is subjected to room-temperature bonding transfer. At this time, an oxide layer has been formed in advance on a substrate that is to be subjected to the hydrogen ion implanting process. If low-cost Silicon On Insulator (SOI) processing such as SIMOX processing is used to implement a sensor, a low-cost sensor can be manufactured.

Now, a method of manufacturing an image sensor for detecting a wide spectrum using a ultrathin-film transfer process will be described. Here, the image sensor may be the image sensor 100 according to the exemplary embodiment illustrated in FIG. 1.

FIGS. 8 through 18 are sectional views of the image sensor 100 when the image sensor 100 is manufactured.

Figure 8:
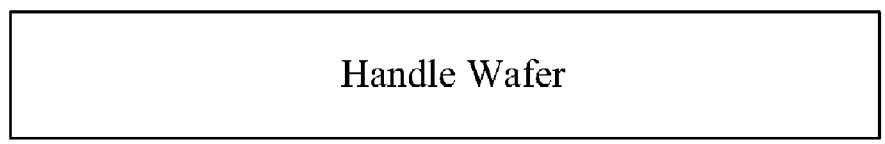
FIGS. 8 through 18 are views for explaining a method of manufacturing the image sensor illustrated in FIG. 1, according to an exemplary embodiment.
Figure 9:
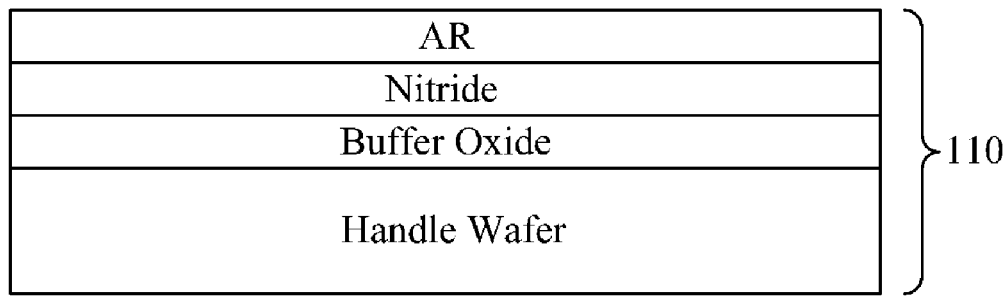

First, a silicon wafer is prepared as a handle wafer, as illustrated in FIG. 8, and a thick buffer oxide layer, a nitride layer and an ONO multi-layer dielectric layer AR are formed sequentially on the handle wafer, thereby preparing a working substrate 110 as illustrated in FIG. 9.

The thickness of the working substrate 110 is preferably from 500 μm to 1000 μm, and more preferably 750 μm. Also, the thickness of the dielectric layer AR is preferably from 500 nm to 1500 nm.

The buffer oxide layer acts as buffer layers between the handle wafer and the nitride layer that is to be transferred in the following process, and remove stress caused by such thin layer transfer.

The dielectric layer AR significantly reduces the amount of light reflected from an incident surface into which light is incident, and the thickness of the dielectric layer AR is preferably from 500 nm to 1500 nm.

Figure 10:
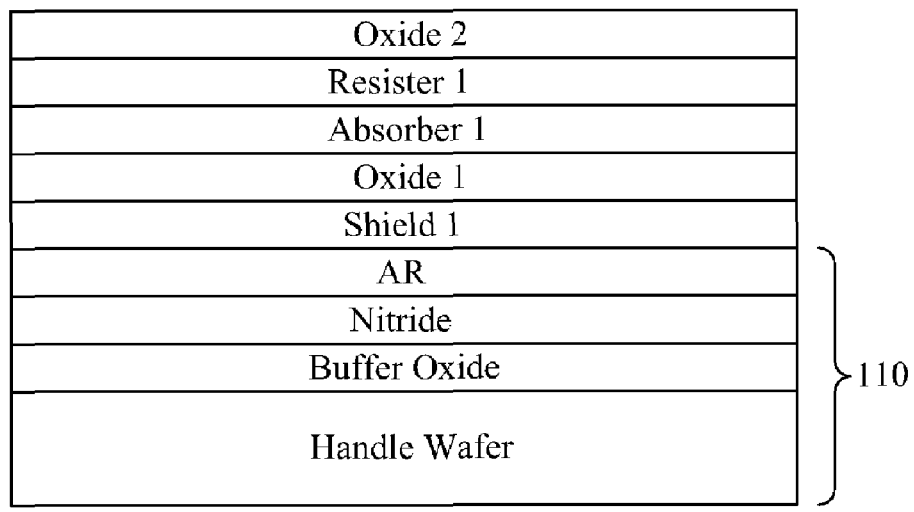
Figure 11:
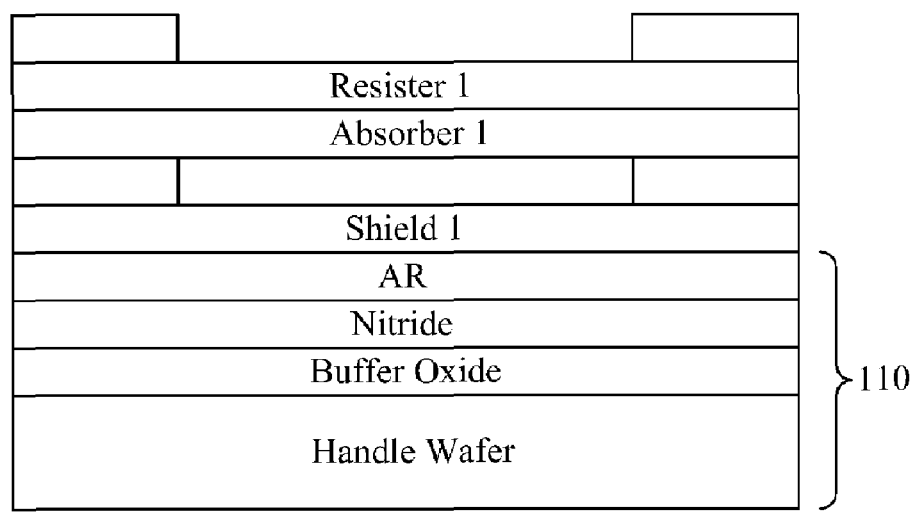

Then, as illustrated in FIG. 10, a silicon layer and an oxide layer are formed sequentially on the dielectric layer AR which is the top layer of the working substrate 110, thereby forming a shield layer Shield 1. Then, a first oxide layer Oxide 1, an absorber Absorber 1, a resistor Resistor 1, and a second oxide layer Oxide 2 are formed sequentially on the shield layer Shield 1, and as illustrated in FIG. 11, the first and second oxide layers Oxide 1 and Oxide 2 are partially etched, so that empty spaces are formed over and below a first detector consisting of the absorber Absorber 1 and the resistor Resistor 1.

Figure 12:
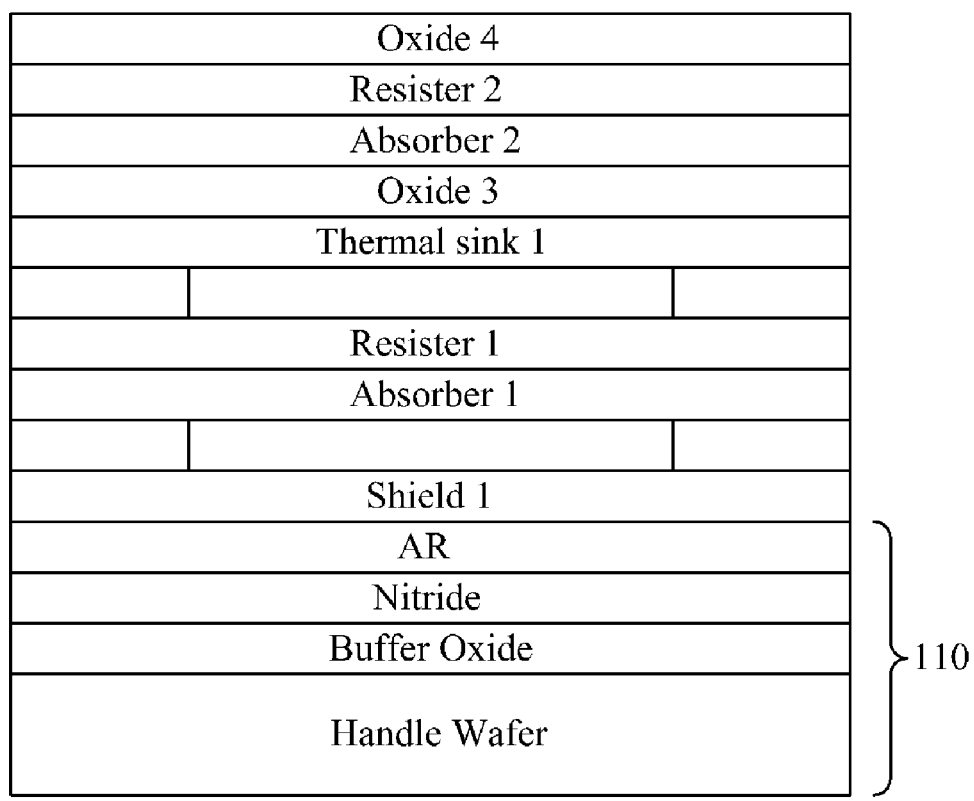
Figure 13:
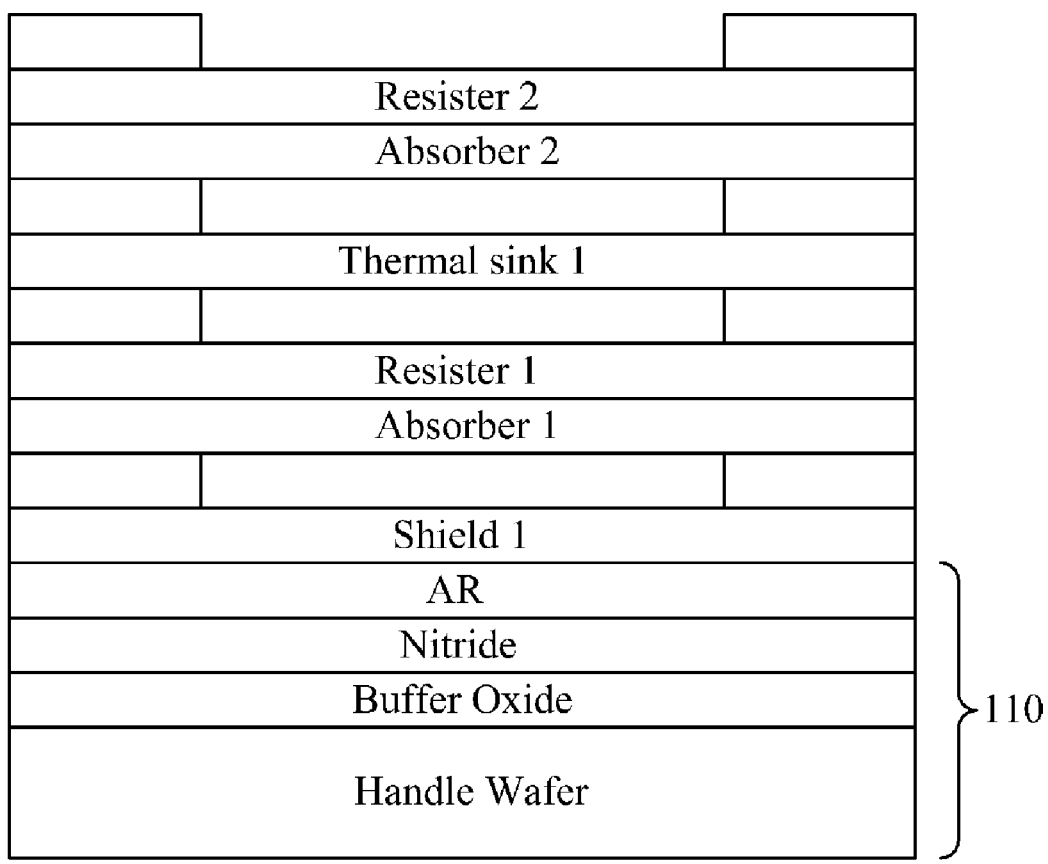

Successively, as illustrated in FIG. 12, a silicon layer and an oxide layer are applied sequentially on the second oxide layer Oxide 2 including the empty space, thus forming a first thermal sink Thermal sink 1. Then, a third oxide layer Oxide 3, an absorber Absorber 2, a resistor Resistor 2, and a fourth oxide layer Oxide 4 are applied sequentially on the first thermal sink Thermal sink 1. Then, as illustrated in FIG. 13, the third and fourth oxide layers Oxide 3 and Oxide 4 are partially etched, so that empty spaces are formed over the upper surface of a second detector and below the lower surface of the second detector, the second detector consisting of the absorber Absorber 2 and resistor Resistor 2.

The absorbers Absorber 1 and Absorber 2 are used to convert photon energy into heat, and may be made of $SiO_2$, $Si_3N_4$, etc., which is a material suitable for a CMOS process. For convenience of description, it is assumed that the absorbers Absorber 1 and Absorber 2 are made of nitride $Si_3N_4$.

The resistors Resistor 1 and Resistor 2 are single-crystalline silicon layers by thin layer transfer process, and are formed with a serpentine structure having a narrow width in order to increase resistance. Since the width of the resistors Resistor 1 and Resistor 2 is very narrow, the oxide layers Oxide 1 and Oxide 3 just below the resistors Resistor 1 and Resistor 2 which are made of single-crystalline silicon can be easily etched when the empty spaces are formed.

Figure 14:
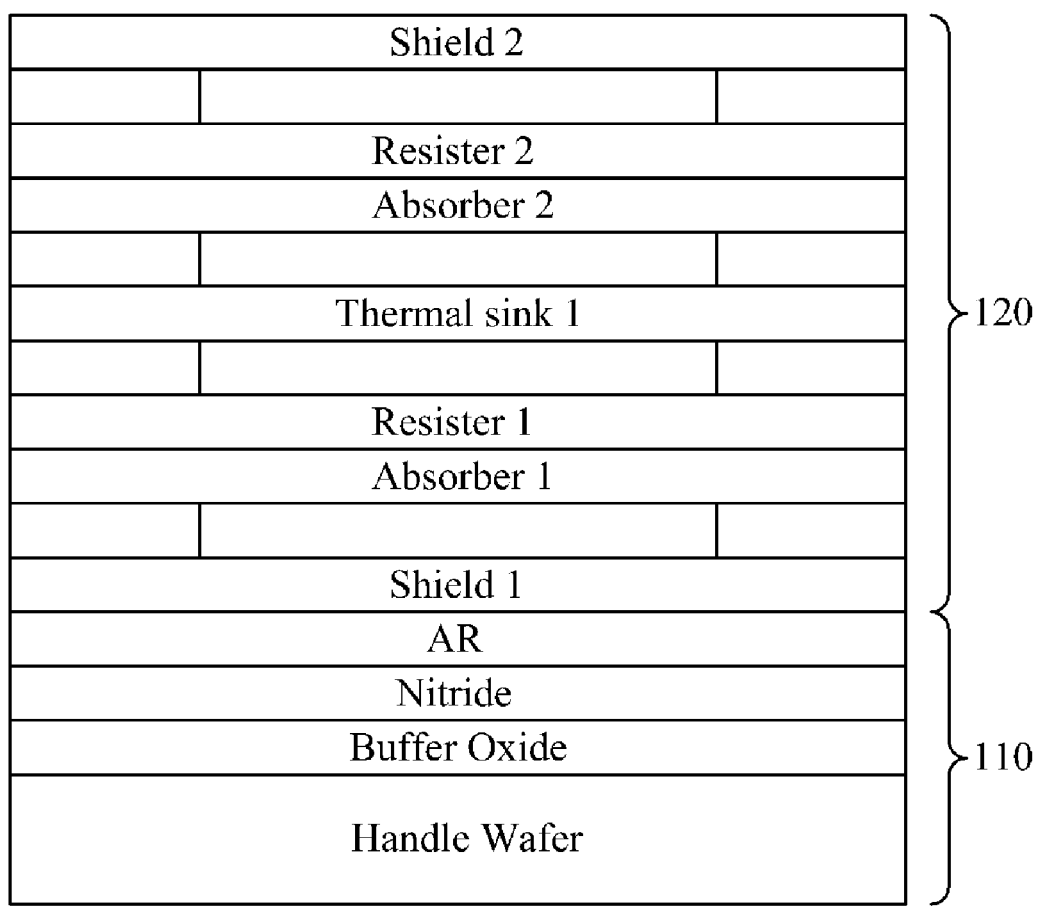

Successively, as illustrated in FIG. 14, a fourth oxide layer Oxide 4 is applied on the resistor Resistor 2, and the fourth oxide layer Oxide 4 is partially etched so that an empty space is formed in the fourth oxide layer Oxide 4. Then, a silicon layer and an oxide layer are applied sequentially on the fourth oxide layer Oxide 4 including the empty space, thus forming a shield layer Shield 2.

The shield layers Shield 1 and Shield 2 separate a micro bolometer layer from other layers that are to be formed in the following operation, thus minimizing influences between neighboring layers.

In this manner, a multi-layer bolometer structure 120 including the micro bolometer layer and the shield layers Shield 1 and Shield 2 is complete. The process of forming the multi-layer micro bolometer structure 120 can be repeatedly performed one or more times to form a plurality of bolometer layers. However, in the specification, for convenience of description, it is assumed that the process of forming the multi-layer micro bolometer structure is performed once. Meanwhile, in the case where the multi-layer micro bolometer structure 120 is repeatedly formed two or more times, a single shield layer will be formed on each multi-layer micro bolometer structure whenever the multi-layer micro bolometer structure is formed.

Figure 15:
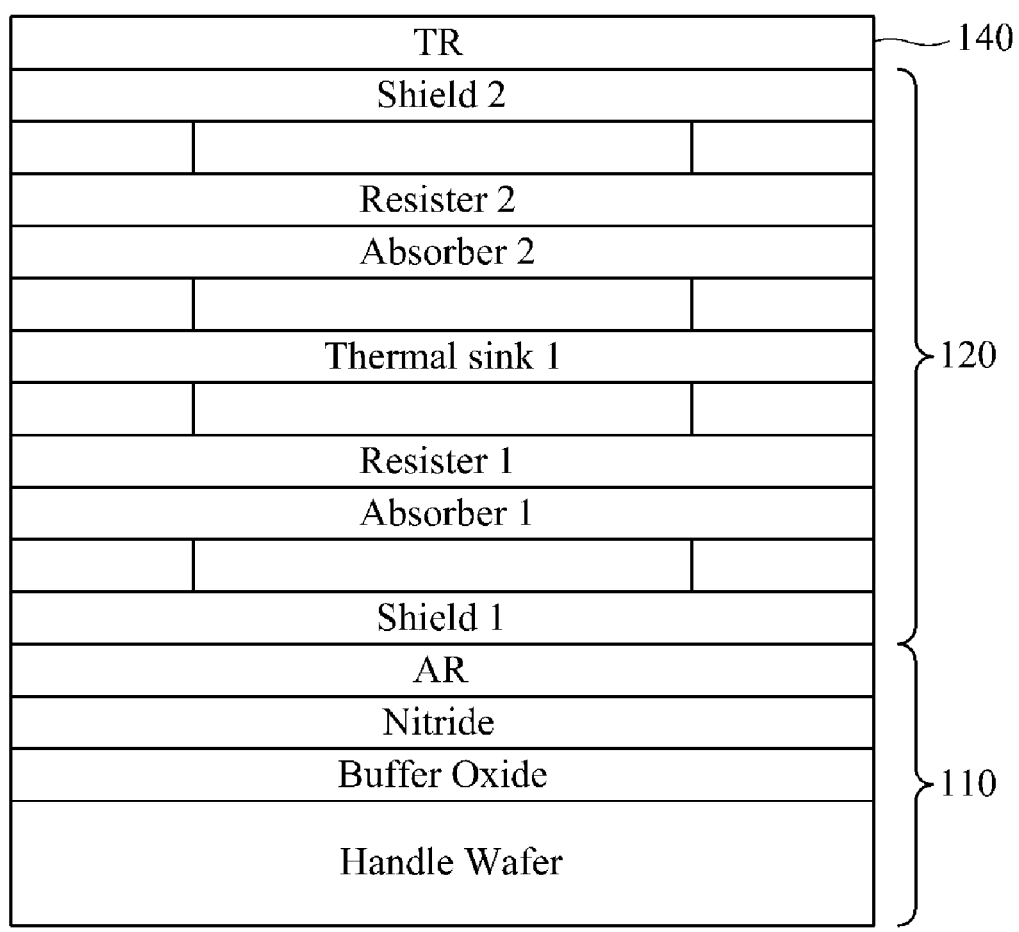

Then, as shown in FIG. 15, a SOI thin layer for forming a transistor layer 140 which is a single-crystalline silicon thin layer through thin-layer transfer is formed on the multi-layer micro bolometer structure 120. At this time, special attention is required to increase a degree of purity of silicon, in order to form a gate oxide with high quality and a good transistor.

Then, by connecting the transistor layer 140 to the resistors Resistor 1 and Resistor 2 of the multi-layer micro bolometer structure 120, and dividing pixels apart, an individual pixel is formed. Processes of connecting the multi-layer micro bolometer structure 120 to the transistor 140 and dividing pixels apart are well known to those skilled in the art, and accordingly, detailed descriptions thereof will be omitted.

Figure 16:
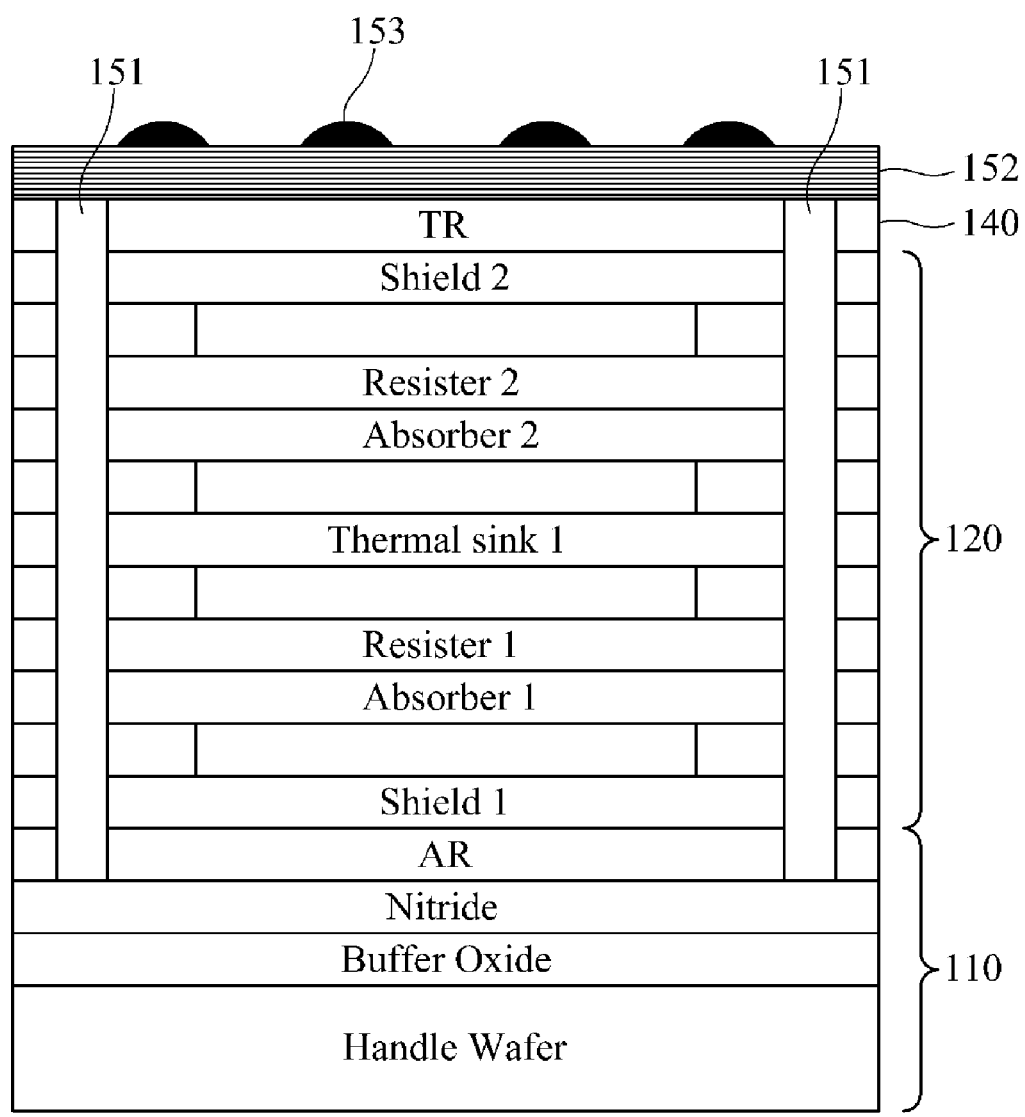

Successively, as illustrated in FIG. 16, a plurality of vertical trenches 151 for defining a pixel area or a chip area are formed, and a layer 152 (hereinafter, referred to as a 'metal layer') in which ILD, metal and BEOL are applied and a plurality of solder bumps 153 are formed on the entire structure. Then, the solder bumps 153 are implemented to package a wafer.

Then, oxide layers are formed in the vertical trenches 151, full pixel definition (FPD), patterning, and etching are performed, and then oxide layers existing around pixels are removed.

Also, the metal layer 152 may have a multi-layer structure as necessary.

Figure 17:
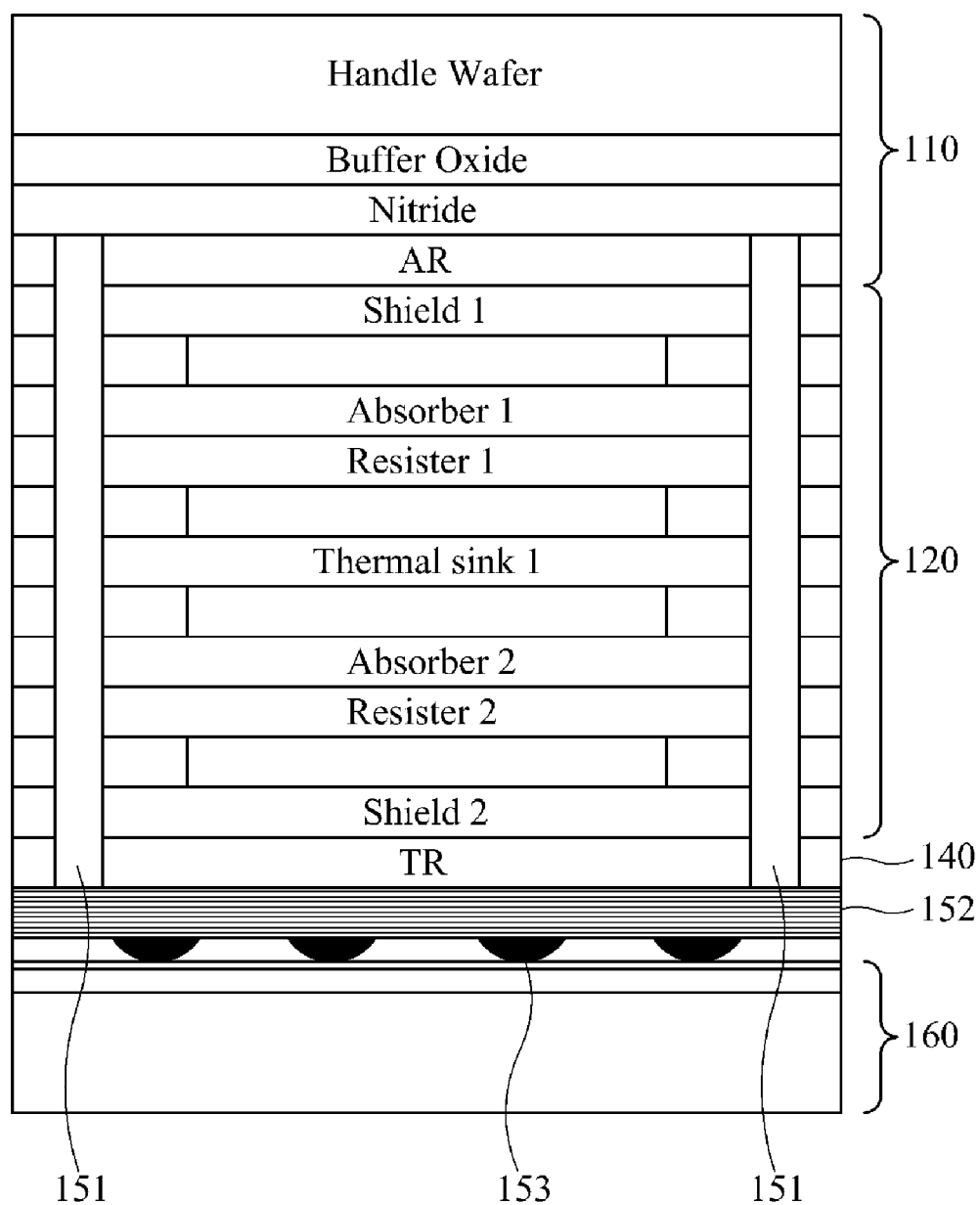

Then, as illustrated in FIG. 17, the structure subjected to the process described above with reference to FIG. 16 is turned over, and the resultant structure is bonded to a supporting substrate 160.

The supporting substrate 160 includes a dielectric layer and a pattern metal layer. The supporting substrate 160 is also turned over and then bonded to the solder bumps 153 so that the patterned metal layer is bonded to the solder bumps 153. The solder bumps 153 are subjected to reflow processing, and then the semiconductor wafer including the solder bumps 153 is bonded to the supporting substrate 160.

At this time, the solder bumps 153 are sealed in order to prevent them from chipping upon wafer sawing.

Figure 18:
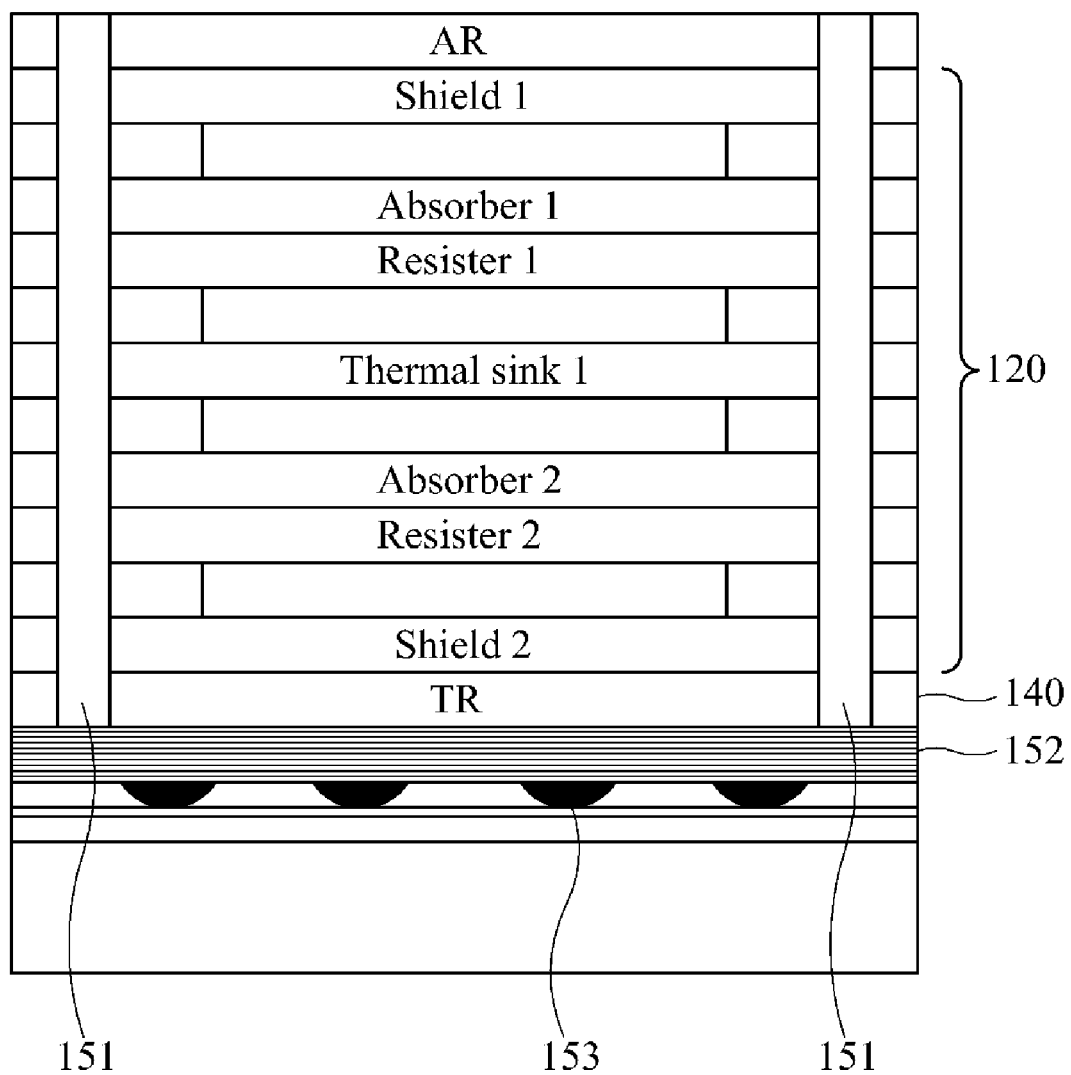

Then, as illustrated in FIG. 18, the buffer oxide and nitride layers of the working substrate 110, except for the dielectric layer AR, are removed using chemical mechanical polishing (CMP) and chemical etching. The nitride layer acts as a stop layer to remove the handle wafer and the buffer oxide layer, and finally the nitride layer is removed.

The reason of removing the buffer oxide and nitride layers of the working substrate 110 is because the image sensor has a back-irradiating type structure and accordingly light is not penetrated through a handle wafer when a thick silicon wafer is used as the handle wafer.

However, the process of removing the buffer oxide and nitride layers of the substrate 110 may be omitted.

In the case where a glass substrate or a crystalline substrate is used as a handle wafer, an image sensor for detecting a wide spectrum, in which two or more micro bolometers are stacked, can be implemented according to the process described above. In this case, neither a handle wafer nor a nitride layer needs to be formed.

A chip separation process removes the oxide trenches 151 using one or two saws (generally, when a laser cutter is used, no vertical trench needs to be formed). Successively, the entire structure (that is, a die) is cut using another saw in order to form a bond shelf. Then, the die is mounted using a technique used generally in semiconductor industries.

Then, a method of manufacturing the image sensor according to another exemplary embodiment illustrated in FIG. 2 will be described briefly.

The method of manufacturing the image sensor 101 according to another exemplary embodiment further includes operation of forming a single-layer micro bolometer layer on the dielectric layer AR which is the top layer of the working substrate 110 between operation of preparing the working substrate 110 (see FIG. 9) and operation of forming the multi-layer micro bolometer structure (see FIGS. 10 through 14), compared to the method of manufacturing the image sensor 100 illustrated in FIG. 1.

The operation of forming the single-layer micro bolometer layer is performed by applying a silicon layer and an oxide layer on the dielectric layer which is the top layer of the working substrate 110 to form a second thermal sink, applying a fifth oxide layer, an absorber, a resistor, and a sixth oxide layer sequentially on the second thermal sink, and partially removing the fifth and sixth oxide layers to form empty spaces. Then, by performing the process described above with reference to FIGS. 10 through 18, the image sensor 101 illustrated in FIG. 2 is complete.

That is, by applying the fifth oxide layer, the absorber, the resistor, the sixth oxide layer, and the second thermal sink sequentially on the multi-layer micro bolometer structure 120 between the operation of forming the multi-layer micro bolometer structure 120 and the operation of forming the SOI thin layer, a single-layer micro bolometer layer can additionally be formed.

Also, when the image sensors 100 and 101 are manufactured, by additionally forming a photodiode layer between the dielectric layer AR and the multi-layer micro bolometer layer 120, it is possible to detect ultraviolet rays, visible rays, near-ultraviolet rays, or a combination of spectrums of various rays. Here, a plurality of photodiode layers can be formed between the dielectric layer AR and the multi-layer micro bolometer layer 120.

As described above, in an image sensor for detecting a wide spectrum and a manufacturing method thereof, according to the present invention, by forming a multi-layer micro bolometer layer having a periodical temperature reset structure in each unit pixel of a single semiconductor device so that a response of each micro bolometer can be correctly synchronized, spectrum information regarding visible rays and near-ultraviolet rays, as well as two or more infrared rays, having different wavelengths, can be acquired, combined and redefined without mechanical/thermal/optical distortion.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. An image sensor for detecting a wide spectrum comprising:
   a multi-layer micro bolometer structure including a multi-layer micro bolometer and two shield layers, wherein the multi-layer micro bolometer include a first detector including an absorber for absorbing light and converting the light into heat and a resistor whose resistance varies according to a change in temperature of the absorber, a first thermal sink separated by an empty space from the lower surface of the first detector, and a second detector having the same structure as a structure of the first detector and separated by an empty space from the lower surface of the first thermal sink, the two shield layers respectively positioned over and below the multi-layer micro bolometer and made of a silicon layer and an oxide layer, and the multi-layer micro bolometer is repeatedly formed one or more times in such a manner that each multi-layer micro bolometer is divided by a shield layer, thereby forming a multi-layer structure; and
   a transistor layer applied on the multi-layer micro bolometer structure, electrically connected to the first detector and the second detector, and processing signals detected by the first detector and the second detector.

2. The image sensor of claim 1, wherein the first detector and the second detector contact the lower and upper surfaces of the first thermal sink, respectively, by electrostatic attraction force generated by applying a potential difference at regular time intervals to the first thermal sink, the first detector, and the second detector.

3. The image sensor of claim 1, wherein a first oxide layer is formed on one of the shield layer, a second oxide layer is formed on the first detector, a third oxide layer is formed on the first thermal sink, and a fourth oxide layer is formed on the second detector, and
   the empty spaces are formed by partially removing the first through fourth oxide layers.

4. The image sensor of claim 1, further comprising:
   a single-layer micro bolometer including a third detector separated by an empty space from the multi-layer micro bolometer and having the same structure as the structure of the first detector, and a second thermal sink separated by an empty space from the third detector,
   wherein the transistor layer is electrically connected to the third detector and processes signals detected by the third detector.

5. The image sensor of claim 4, wherein the first detector and the second detector contact the lower and upper surfaces of the first thermal sink, respectively, by electrostatic attraction force generated by applying a potential difference at regular time intervals to the first thermal sink, the first detector and the second detector, and
   the third detector contacts the second thermal sink by electrostatic attraction force generated by applying a potential difference at regular time intervals to the second thermal sink and the third detector.

6. The image sensor of claim 4, wherein a first oxide layer is formed on one of the shield layer, a second oxide layer is formed on the first detector, a third oxide layer is formed on the first thermal sink, a fourth oxide layer is formed on the second detector, a fifth oxide layer is formed on the second thermal sink, and a sixth oxide layer is formed on the third detector, and
   the empty spaces are formed by partially removing the first through sixth oxide layers.

7. The image sensor of claim 1, wherein the absorber has a multi-layer structure including at least one of a nitride ($Si_3N_4$) layer, an oxide layer, or a dielectric layer, and has wavelength selectivity.

8. The image sensor of claim 1, wherein the resistor is a single-crystalline silicon thin layer with a serpentine structure having a narrow, curved shape.

9. The image sensor of claim 1, wherein the two shield layers each includes a silicon layer and an oxide layer and is grounded.

10. The image sensor of claim 1, wherein the transistor layer has a MOS semiconductor structure.

11. The image sensor of claim 10, wherein the MOS semiconductor structure is a transistor manufactured using a bulk semiconductor process.

12. The image sensor of claim 10, wherein the MOS semiconductor is a bipolar junction transistor (BJT) insolated by dielectric or a flip-fet transistor isolated by dielectric.

13. The image sensor of claim 10, wherein the MOS semiconductor structure is a transistor having four terminals of a source, a drain, a top-side gate, and a back-side gate.

14. The image sensor of claim 1, wherein by forming a photo diode layer on the multi-layer micro bolometer structure, a ultraviolet ray, a visible ray, a near- infrared ray, or a combination of spectrums of the ultraviolet ray, the visible ray, and the near-infrared ray is detected.

15. A method of manufacturing an image sensor, comprising:
   forming a buffer oxide layer and a dielectric layer sequentially on an upper surface of a handle wafer, thus preparing a working substrate;
   forming a first oxide layer, a first absorber, a first resistor, a second oxide layer, a first thermal sink, a third oxide layer, a second absorber, a second resistor, and a fourth oxide layer, sequentially, on the dielectric layer which is a top layer of the working substrate, thus forming a multi-layer micro bolometer, wherein the multi-layer micro bolometer is repeatedly formed one or more times to form a multi-layer bolometer structure;
   forming a silicon-on-insulator (SOI) thin layer on the multi-layer micro bolometer structure;
   forming a transistor circuit on the SOI thin layer;
   electrically connecting the transistor circuit to the first resistor and the second resistor; and
   forming a metal layer including a bump on the transistor circuit.

16. The method of claim 15, further comprising forming a second thermal sink, a fifth oxide layer, a third absorber, a third resistor, and a sixth oxide layer on the dielectric layer which is the top layer of the working substrate, between the preparing of the working substrate and the forming of the multi-layer micro bolometer structure, thus forming a single-layer micro bolometer on the multi-layer bolometer structure, wherein the transistor circuit is connected to the third resistor.

* * * * *